(12) United States Patent
Ito

(10) Patent No.: US 10,036,546 B2
(45) Date of Patent: Jul. 31, 2018

(54) LAMP AND MANUFACTURING METHOD THEREOF

(71) Applicant: Koito Manufacturing Co., Ltd., Tokyo (JP)

(72) Inventor: Noriaki Ito, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/334,439

(22) Filed: Oct. 26, 2016

(65) Prior Publication Data

US 2017/0138583 A1 May 18, 2017

(30) Foreign Application Priority Data

Nov. 18, 2015 (JP) .................................. 2015-225451
Apr. 26, 2016 (JP) .................................. 2016-087618

(51) Int. Cl.
*B60Q 1/06* (2006.01)
*F21V 29/00* (2015.01)
(Continued)

(52) U.S. Cl.
CPC .............. *F21V 29/80* (2015.01); *F21V 23/06* (2013.01); *H01L 33/52* (2013.01); *H01L 33/62* (2013.01);
(Continued)

(58) Field of Classification Search
CPC .......... F21V 29/80; F21V 23/06; H01L 33/52; H01L 33/62; H01L 2933/005; H01L 2933/0066; F21Y 2115/30; F21Y 2115/10
(Continued)

(56) References Cited

U.S. PATENT DOCUMENTS 8,851,736 B2 * 10/2014 Lee ..................... H05K 1/0209
362/294
2008/0253120 A1 10/2008 Okimura
(Continued)

FOREIGN PATENT DOCUMENTS

DE 102009060780 A 6/2011
DE 102010041831 A 4/2012
(Continued)

OTHER PUBLICATIONS

Machine English Translation of DE102013009146 (A1) Dec. 4, 2014 Neumann et al.*
(Continued)

*Primary Examiner* — Anh Mai
*Assistant Examiner* — Glenn Zimmerman
(74) *Attorney, Agent, or Firm* — Abelman, Frayne & Schwab

(57) ABSTRACT

According to the present disclosure, a first optical system includes a first light source and emits a first illumination light. A second optical system includes a second light source and emits a second illumination light. A controller controls turning-on/off of the first light source and the second light source. The first optical system and the second optical system are configured such that a first illumination standard is satisfied by the first illumination light and the second illumination light. The first optical system is configured such that a second illumination standard is satisfied by the first illumination light. The controller allows the turning-on of the first light source when the turning-on of the second light source is disabled, and prohibits the turning-on of the second light source when the turning-on of the first light source is disabled.

9 Claims, 11 Drawing Sheets

(51) Int. Cl.
*F21V 29/80* (2015.01)
*H01L 33/62* (2010.01)
*F21V 23/06* (2006.01)
*H01L 33/52* (2010.01)
*F21Y 115/10* (2016.01)
*F21Y 115/30* (2016.01)

(52) U.S. Cl.
CPC ........ *F21Y 2115/10* (2016.08); *F21Y 2115/30* (2016.08); *H01L 2933/005* (2013.01); *H01L 2933/0066* (2013.01)

(58) Field of Classification Search
USPC .................. 362/373, 362, 84, 217.1, 217.14
See application file for complete search history.

(56) References Cited

U.S. PATENT DOCUMENTS

| | | | |
|---|---|---|---|
| 2010/0091464 A1* | 4/2010 | Ohnishi | H01L 23/053 361/723 |
| 2011/0110059 A1 | 5/2011 | Grajcar | |
| 2011/0267814 A1 | 11/2011 | Moon et al. | |
| 2011/0299292 A1 | 12/2011 | Preuschl | |
| 2014/0036497 A1* | 2/2014 | Hussell | F21V 29/004 362/235 |
| 2015/0325740 A1* | 11/2015 | Serita | F21S 48/328 257/98 |
| 2016/0033105 A1* | 2/2016 | Odnoblyudov | F21V 3/049 362/249.02 |

FOREIGN PATENT DOCUMENTS

| | | | |
|---|---|---|---|
| DE | 102013009146 A1 | 12/2014 | |
| JP | 2008-282932 A | 11/2008 | |
| JP | 2008282932 A * | 11/2008 | ............ H01L 33/62 |
| JP | 2011-192905 A | 9/2011 | |
| JP | 2014-146440 A | 8/2014 | |

OTHER PUBLICATIONS

An European Search Report dated Apr. 10, 2017, issued from the European Patent Office (EPO) of European Patent Application No. 16199159.1.

* cited by examiner

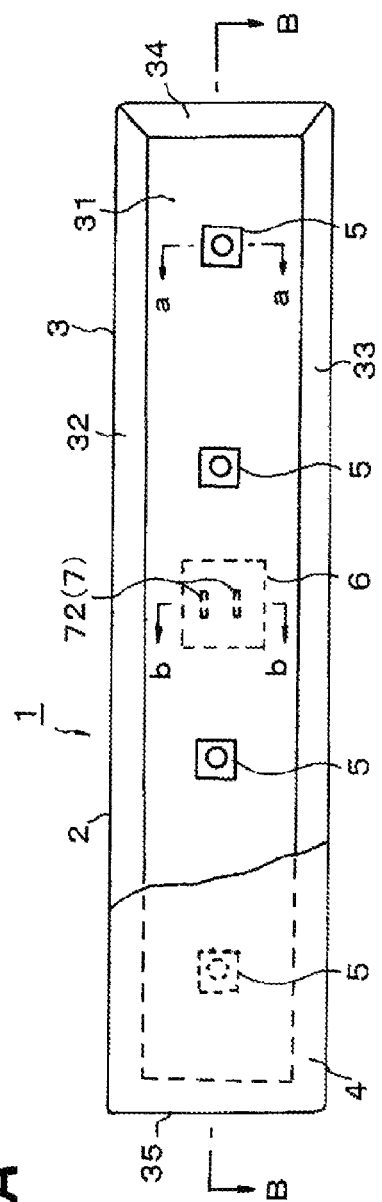
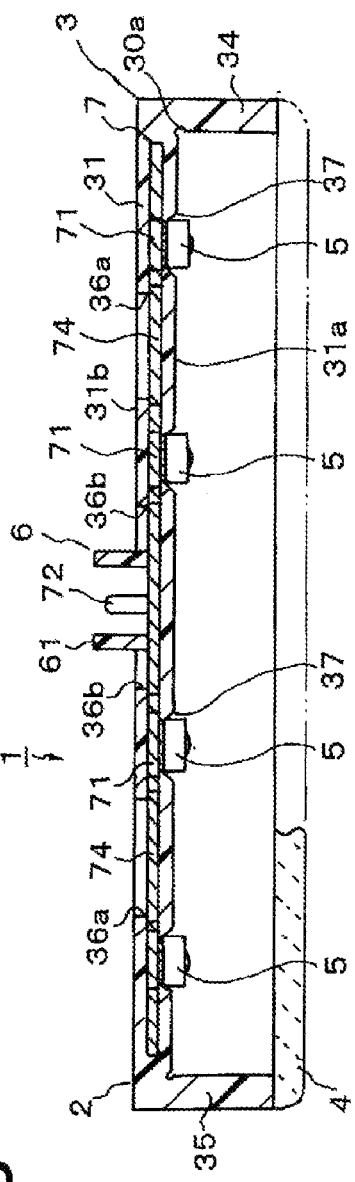

LAMP AND MANUFACTURING METHOD THEREOF

CROSS-REFERENCE TO RELATED APPLICATIONS

This application is based on and claims priority from Japanese Patent Application Nos. 2015-225451 and 2016-087618, filed on Nov. 18, 2015 and Apr. 26, 2016, respectively, with the Japan Patent Office, the disclosures of which are incorporated herein in their entireties by reference.

TECHNICAL FIELD

The present disclosure relates to a lamp using a light emitting element such as, for example, a light emission diode (LED) or a laser diode (LD) as a light source. In particular, the present disclosure relates to a lamp in which the heat dissipating property of the light emitting element is improved, the number of components is reduced, and the assembly work is facilitated.

BACKGROUND

Many lamps using the above-described type of a light emitting element as a light source adopt the configuration in which a light source unit is constituted by mounting one or more light emitting elements in a circuit board (e.g., a printed wiring board), and the light source unit is equipped in a lamp housing. For example, in a vehicle lamp for an automobile, the light source unit is equipped in the lamp housing in a state where the inside of the lamp housing is almost hermetic, in order to protect the light source unit from an external environment.

In this lamp, when the light source unit emits light, the temperature inside the lamp housing may increase due to heat generated from the light emitting element as the light source, and the temperature of the light emitting element may also increase accordingly. Thus, due to the so-called thermal runaway, the thermal reliability of the light emitting element may be deteriorated. Hence, it is required to dissipate the heat of the light emitting element to the outside of the lamp housing.

For example, Japanese Laid-Open Patent Publication No. 2014-146440 discloses a configuration in which a heat dissipating member is integrated with the rear side inner surface of a lamp housing opposite to the rear surface of a circuit board, and an opening is formed at the corresponding rear side inner surface to expose the heat dissipating member to the outside. According to this configuration, the heat generated from the light emitting element may be transferred to the heat dissipating member from the circuit board, and dissipated to the outside through the opening. In addition, Japanese Laid-Open Patent Publication No. 2011-192905 discloses a technique in which a conductive member also serving as a heat dissipating member is integrally embedded in a resin-made lamp housing.

SUMMARY

The technique of Japanese Laid-Open Patent Publication No. 2014-146440 integrates the heat dissipating member, which is a separate member from the lamp housing, with the lamp housing through, for example, a bonding. Hence, the heat dissipating member is required separately from the circuit board, thereby increasing the number of components, and furthermore, increasing the number of assembly work processes.

The technique of Japanese Laid-Open Patent Publication No. 2011-192905 is advantageous in reducing the number of components because the conductive member integrated with the lamp housing also serves as a heat dissipating member so that an independent circuit board and an independent conductive member are not required. However, in Japanese Laid-Open Patent Publication No. 2011-192905, since the conductive member is integrated with the box-shaped lamp housing, the work of mounting the light emitting element on the conductive member is complicated. That is, since the board surface on which the light emitting element is to be mounted is not flat, it is difficult to apply the technique of automatically mounting the light emitting element by a so-called reflow method, and the mounting by a manual operation is required. This makes the lamp assembly work complicated.

An object of the present disclosure is to provide a lamp and a manufacturing method thereof in which the heat dissipating property of the light emitting element is improved, the number of components is reduced, and the assembly work is simplified by enabling the automatic mounting of the light emitting element.

The lamp of the present disclosure includes a resin-made body in which a conductive lead frame is integrally molded, and a light emitting element mounted on the corresponding lead frame. A pad is installed in the lead frame and exposed within a concave portion formed on the surface of the body. The light emitting element is mounted on the pad within the corresponding concave portion.

In the lamp of the present disclosure, the edges of the concave portion are formed as tapered surfaces in the thickness direction, and the outer edges of the light emitting element are in contact with the corresponding tapered surfaces. In addition, the body is formed as a lamp housing of which at least a part is bending-processed. In addition, the body includes a connector case formed by bending-processing at least a part of the body, and a connector terminal formed by bending-processing a part of the lead frame within the connector case. In this case, the body has the configuration in which a window is opened at a position adjacent to the connector case, and at least a part of the lead frame is exposed to the corresponding window.

In addition, in the present disclosure, the body may include one or more heat dissipating pins which project from the rear surface of the body. In addition, at least a part of the lead frame is curved, and each heat dissipating pin is formed as a heat dissipating pin in which the curved part is embedded inside the body. Alternatively, the heat dissipating pin may have a configuration in which the curved part is exposed to the outside from the inside of the body. In addition, the concave portion may include a sealing portion that covers the pad and the light emitting element.

The lamp manufacturing method of the present disclosure may include processing a conductive lead frame into a pattern shape having at least a pad and a connector terminal, forming a body by integrally molding the lead frame with a resin material, mounting a light emitting element on the pad exposed within a concave portion provided in the body, and forming a lamp housing by bending-processing a part of the body. This manufacturing method may further include bending-processing the connector terminal exposed to the body, and forming a connector case in a part of the body.

According to the lamp of the present disclosure, since the lead frame is integrally molded with the body, and the pad of the lead frame is exposed in the concave portion provided in the body, the lamp may be formed by mounting a light emitting element in the body and mounting a front lens in the body. Accordingly, the lamp may be constituted with the minimum number of components. Further, the lamp housing or the connector may be configured by bending-processing the body and the lead frame, thereby facilitating the manufacturing. The heat dissipating effect of the light emitting element may be further improved by installing a heat dissipating pin in the body or including a bending-processed curved portion in the lead frame. In addition, by providing the sealing portion in the concave portion, the light emitting element and the pad may be protected from the external environment, and the relevant reliability may be improved.

According to the manufacturing method of the present disclosure, the light emitting element may be surface-mounted on the body in which the lead frame is integrally molded, by an automatic machine. Further, the lamp housing and the connector may be formed by bending-processing the body and the lead frame. Accordingly, the lamp may be easily manufactured while reducing the number of lamp assembly processes.

The above-described summary is illustration purposes only and does not intend to limit in any ways. In addition to the illustrative embodiment, examples, and features described above, additional embodiment, example, and features will become apparent by referring to the drawings and the following detailed description.

BRIEF DESCRIPTION OF THE DRAWINGS

FIG. 2A is a front view of a body, and FIG. 2B is a cross-sectional view taken along the line B-B in FIG. 2A.

DETAILED DESCRIPTION

In the following detailed description, reference is made to the accompanying drawing, which form a part hereof. The illustrative exemplary embodiments described in the detailed description, drawings, and claims are not meant to be limiting. Other exemplary embodiments may be utilized, and other changes may be made, without departing from the spirit or scope of the subject matter presented here.

Exemplary Embodiment 1

Figure 1A:
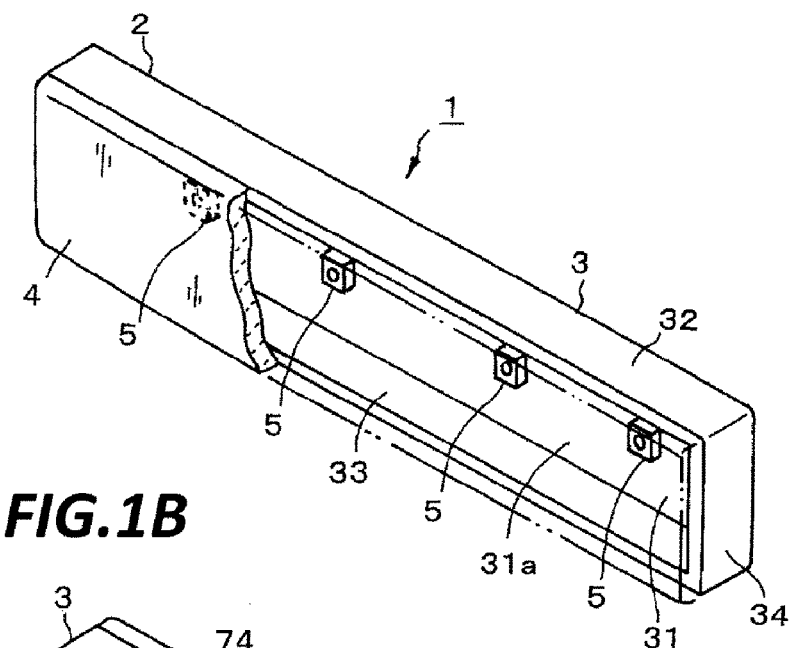
FIG. 1A is a partially cutaway appearance perspective view of an HMSL of Exemplary Embodiment 1 when viewed from the front side.
Figure 1B:
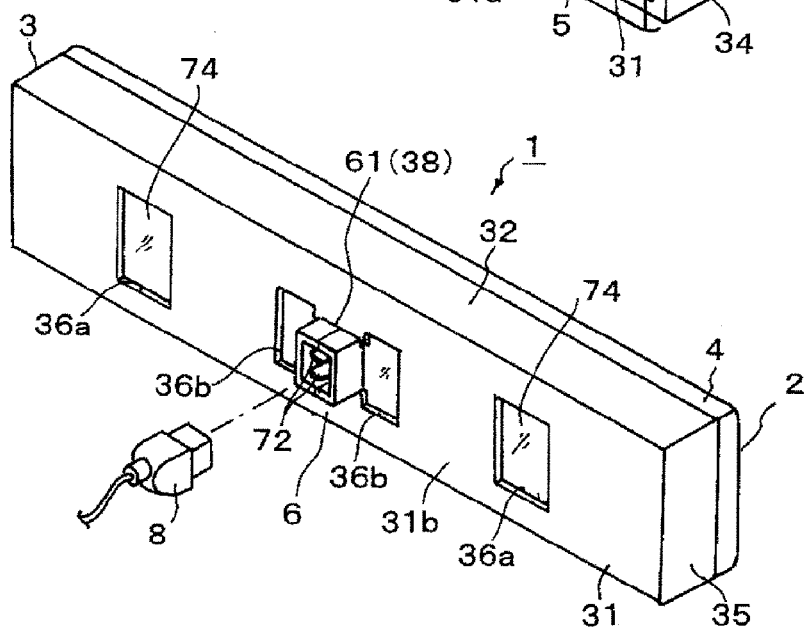
FIG. 1B is an appearance perspective view of the same when viewed from the rear side.

Hereinafter, exemplary embodiments of the present disclosure will be described with reference to the drawings. FIGS. 1A and 1B are appearance perspective views of Exemplary Embodiment 1 which applies the present disclosure to a high mount stop lamp (HMSL) as one of automobile lamps. FIG. 1A is a partially cutaway appearance perspective view of the HMSL when viewed in the front direction, and FIG. 1B is an appearance perspective view of the same when viewed in the rear direction.

In the HMSL 1, as illustrated in FIG. 1A, a lamp housing 2 is constituted with a body 3 having a horizontally long container shape of which the front side is opened, and a front lens 4 mounted on the front opening of the body 3. A plurality of light sources 5 are arranged and supported horizontally inside the lamp housing 2 (here, the body 3). The HMSL 1 is equipped in the rear side portion of an automobile body (not illustrated) in a state where the front lens 4 is directed toward the rear side of the automobile, and turned on, for example, at a time of operating the brake of the automobile.

The body 3 is formed in a rectangular container shape including a rectangular bottom portion 31 and four side portions 32 to 35 surrounding the bottom portion 31. The above-described plurality of light emitting elements as light sources (here, four (4) rectangular LED chips 5) are mounted on the inner bottom surface 31a of the bottom portion 31. The four LED chips 5 are arranged in a row along the longitudinal direction of the body 3 at required intervals, and individually surface-mounted on the inner bottom surface 31a of the body 3.

As illustrated in FIG. 1B, a connector 6 is integrally formed on the outer bottom surface 31b of the bottom portion 31 of the body 3. The connector 6 is configured to make a power source connector 8 connected to an on-automobile body power source attachable/detachable, and to be fed with a power to cause the LED chips 5 to emit light. In addition, a plurality of windows 36a and 36b to be described later are opened in the outer bottom surface 31b.

FIG. 2A is a front view of the HMSL 1, and FIG. 2B is a cross-sectional view taken along the line B-B of FIG. 2A. The body 3 is formed in a plate shape by molding a heat resistant resin such as, for example, a polyphenylene sulfide (PPS) resin, and then, formed in the above-described rectangular container shape by a subsequent processing. A lead frame 7 formed of a copper material is integrally embedded inside the body 3 through, for example, insert-molding. The lead frame 7 is embedded within the area of the bottom portion 31 of the body 3, and is not embedded within the areas of the four side portions 32 to 35.

Figure 3:
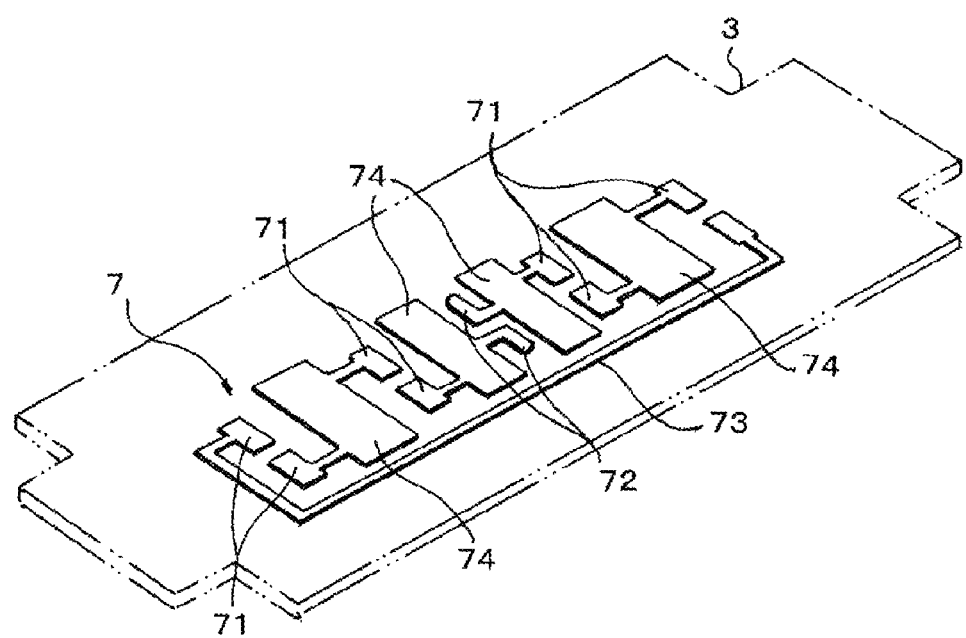
FIG. 3 is a perspective view of a lead frame.

The lead frame 7 is formed by a patterning and a bending of a conductive metal plate such as, for example, copper. FIG. 3 represents the state prior to the bending. The lead frame 7 includes four pairs of LED pads 71 on which the four LED chips 5 are to be mounted, respectively, a pair of connector terminals 72 constituting a terminal of the connector 6, and a wiring portion 73 electrically connecting the LED pads 71 and the connector terminals 72 to each other. Further, here, the lead frame 7 also includes four heat dissipating portions 74 each having a rectangular plate shape with a required area. Further, if needed, the lead frame 7 includes a component pad that mounts thereon an electronic component constituting a light emission circuit to cause the light emission of the LED chips 5. However, the present exemplary embodiment represents an example where no component pad is provided.

Figure 4A:
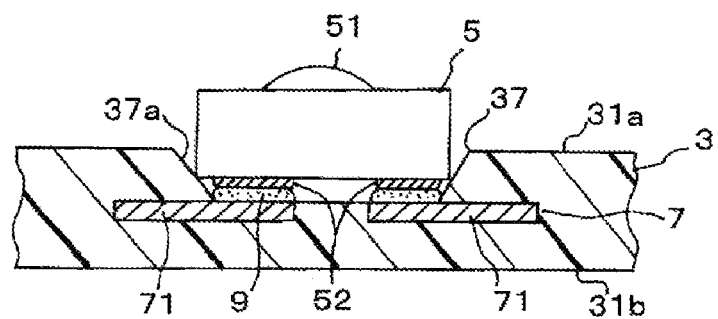
FIG. 4A is an enlarged cross-sectional view taken along the line a-a in FIG. 2A.

FIG. 4A is an enlarged cross-sectional view taken along the line a-a in FIG. 2A. Rectangular concave portions 37 are formed at positions corresponding to the four pairs of LED pads 71 of the lead frame 7, respectively, in the inner bottom surface 31$a$ of the bottom portion 31 of the body 3. The four pairs of LED pads 71 are exposed on the inner bottom surfaces of the four concave portions 37, respectively. Each concave portion 37 is formed to have longitudinal and lateral dimensions corresponding to the external appearance of each LED chip 5 to be mounted, and the four edges of the concave portion 37 are formed as tapered surfaces 37$a$ inclined outwardly in the plate thickness direction.

A light emitting surface portion 51 of each LED chip 5 is directed toward the front opening of the body 3, and electrodes 52 including a pair of positive and negative electrodes are provided on the rear surface of the LED chip 5 opposite to the light emitting surface of the LED chip 5, and soldered to the LED pad 71 via a reflow solder 9 so that the LED chip 5 is mounted on the LED pad 71. In the mounted state, the four outer edges of the LED chip 5 at the rear side thereof are in a state of being in contact with the four tapered surfaces 37$a$ of the concave portion 37, respectively.

Figure 4B:
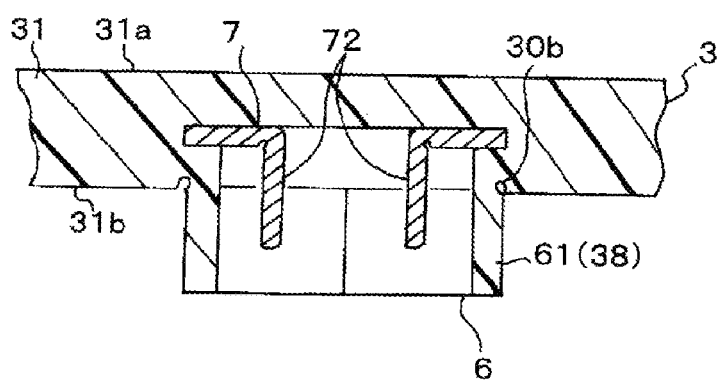
FIG. 4B is an enlarged cross-sectional view taken along the line b-b in FIG. 2A.

FIG. 4B is an enlarged cross-sectional view taken along the line b-b of FIG. 2A. A rectangular cylinder-shaped connector case 61 is formed on a part of the outer bottom surface 31$b$ of the body 3 integrally with the body 3 and constituted with piece portions 38 as a part of the body 3, as described later. Inside the connector case 61, the pair of connector terminals 72 of the lead frame 7 are arranged in a vertically bent state. The connector case 61 and the connector terminals 72 constitute the connector 6. The power source connector 8 may be inserted into the connector case 61, and when the power source connector 8 is inserted thereinto, the pair of connector terminals 72 are electrically connected to the corresponding power source connector 8.

In addition, as illustrated in FIGS. 1B and 2B, rectangular windows 36$a$ and 36$b$ are opened in the outer bottom surface 31$b$ of the body 3 at opposite sides of the connector case 61, and at opposite sides of the outer sides from the opposite sides of the connector case 61, respectively. The heat dissipating portions 74 of the lead frame 74 are partially exposed in the windows 36$a$ and 36$b$. Since the windows 36$a$ and 36$b$ are closed by the heat dissipating portions 74 or a part of the bottom portion 31, the inner bottom surface 31$a$ of the body 3 does not communicate with the outer bottom surface 31$b$ side through the windows 36$a$ and 36$b$.

The front lens 4 is made of a translucent resin and formed in a rectangular plate shape. The front lens 4 is mounted on the front opening of the body 3. Here, the circumferential edge of the front lens 4 is welded or bonded to the opening edge of the body 3. Instead of the welding or bonding, the front lens 4 may be mounted on the body 3 by, for example, integrally forming tongue-like engagement pieces at the longitudinal opposite ends of the front lens 4, respectively, and engaging the engagement pieces with engagement holes formed to project from the longitudinal opposite side surfaces of the body 3, though not illustrated.

In addition, a lens step may be formed on the inner surface of the front lens 4 to cause the light emitted from the LED chips 5 to be refracted and emitted toward the front side of the HMSL with a required light distribution. The lens step may adopt, for example, a configuration in which the inner surface of the front lens 4 is divided into plural vertical and horizontal square blocks, and a fine spherical lens is integrally formed in each block.

The HMSL 1 configured as described above is supplied with a required power, for example, currents, from the power source connector 8 inserted into the connector 6. The currents are supplied to the wiring portion 73 from the connector terminals 72 and further supplied to the four LED pads 71. The four LED chips 5 are supplied with the currents through the LED pads 71 on which the LED chips 5 are mounted, respectively, so as to emit light. The light emitted from each of the LED chips 5 penetrates through the front lens 4 and is refracted by the lens step of the front lens 4 to irradiate the front side of HMSL 1 with a required light distribution. In addition, the inner surface of the body 3 may be subject to a surface processing to serve as a light reflecting surface such that the reflected light of the light emitted from the LED chips 5 is emitted from the front lens 4.

When each LED chip 5 emits light, the LED chip 5 generates heat. The generated heat is transferred to the LED pads 71 of the lead frame 7, and further transferred to the wiring portion 73 or the heat dissipating portions 74. Then, the heat is directly dissipated to the outside from the heat dissipating portions 74 exposed to the windows 36 opened at the outer bottom surface 31$b$ of the body 3. In addition, the heat is transferred to the bottom portion 31 of the body 3 from the wiring portion 73 or the heat dissipating portions 74 and dissipated from the outer bottom surface. Accordingly, the temperature rise of the LED chips 5 and the thermal runaway resulting therefrom are suppressed so that the thermal reliability is improved.

Further, since the HMSL1 includes the three parts which include the four LED chips 5 as light sources, the body 3, and the front lens 4, the number of the components is small, and the assembly work may be simplified. Especially, since the lead frame 7 configured to supply a power to the LED chips 5 is integrally embedded in the body 3, the work of assembling the lead frame 7 mounted with the LED chips 5 in the body 3 is unnecessary.

FIG. 5A to FIG. 7B are schematic perspective views for explaining a manufacturing method of the above-described HMSL. First, as illustrated in FIG. 3, a flat copper plate is subject to a patterning so as to form the lead frame 7 including the four pairs of LED pads 71, the pair of connector terminals 72, the wiring portion 73 electrically connecting the LED pads 71 and the connector terminals 72 to each other, and the rectangular heat dissipating portions 74 also serving as a part of the wiring portion 73. In this state, the lead frame 7 is not yet subject to the bending.

Here, in the actual lead frame 7, since the electrically separated portions of the respective components 71 to 74 are kept in a state of being mechanically connected to each other, a dummy connecting portion is formed as needed. However, here, the dummy connecting portion is not illustrated. In addition, as represented by the alternate long and two dot line in FIG. 3, the resin-made body 3 in which the lead frame 7 is insert-molded is formed.

Figure 5A:
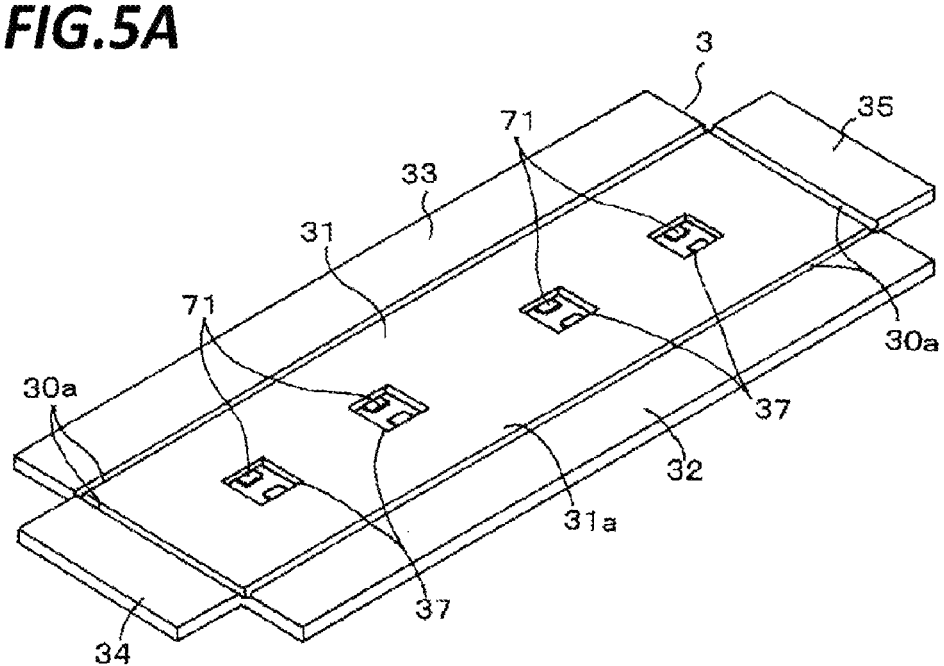
FIGS. 5A and 5B are schematic perspective views for explaining a manufacturing process (part 1).
Figure 5B:
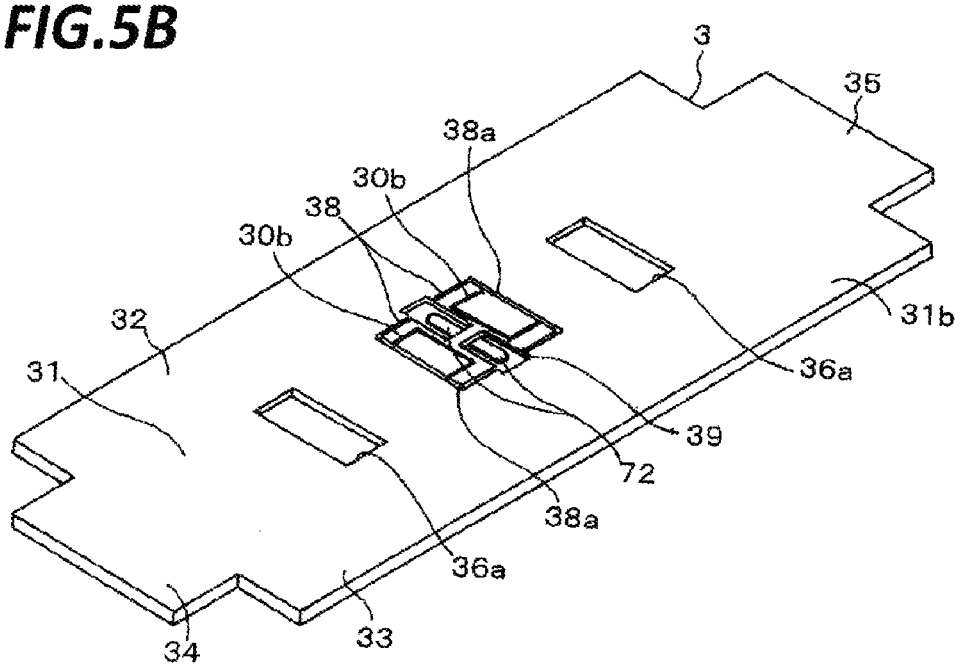

The formed body 3 is molded in a flat plate shape in which the bottom portion 31 and the four side portions 31 to 35 are developed, as represented by the front side perspective view in FIG. 5A and the rear side perspective view in FIG. 5B. In addition, concave grooves each having a reduced thickness are formed at the positions where the four side portions 32 to 35 of the body 3 are connected to the bottom portion 31, along the boundaries between the side portions 32 to 35 and the bottom portion 31, respectively. The concave grooves are formed as so-called integral hinges 30a enabling bending of the boundary portions between the bottom portion 31 and the respective side portions 32 to 35 in the thickness direction. The lead frame 7 is embedded only in the bottom portion 31 of the body 3, and is not pushed out to the side portions 32 to 35 beyond the integral hinges 30a.

The concave portions 37 are formed on the inner bottom surface 31a of the molded body 3, and the LED pads 71 of the lead frame 7 are exposed to the inner bottom surfaces of the concave portions 37. Meanwhile, an opening 39 is provided at the portion of the outer bottom surface 31b of the body 3 where the connector terminals 72 of the lead frame 7 are formed, and the connector terminals 72 are exposed within the opening 39. In addition, the rectangular windows 36a are opened at the areas corresponding to parts of the heat dissipating portions 74 of the lead frame 7, and the parts of the heat dissipating portions 74 are exposed in the windows 36a, respectively.

In the outer bottom surface 31b of the body 3, a pair of substantially U-shaped slits 38a are formed to face to each other at the opposite sides of the body 3 between which the opening 39 is interposed, here, the longitudinal opposite sides of the body 3. The slits 38a are formed at the areas corresponding to the other parts of the heat dissipating portions 74 of the lead frame 7, and substantially U-shaped integral hinges 30b are formed facing the slits 38a in the piece portions 38 surrounded by the slits 38a, respectively.

Figure 6:
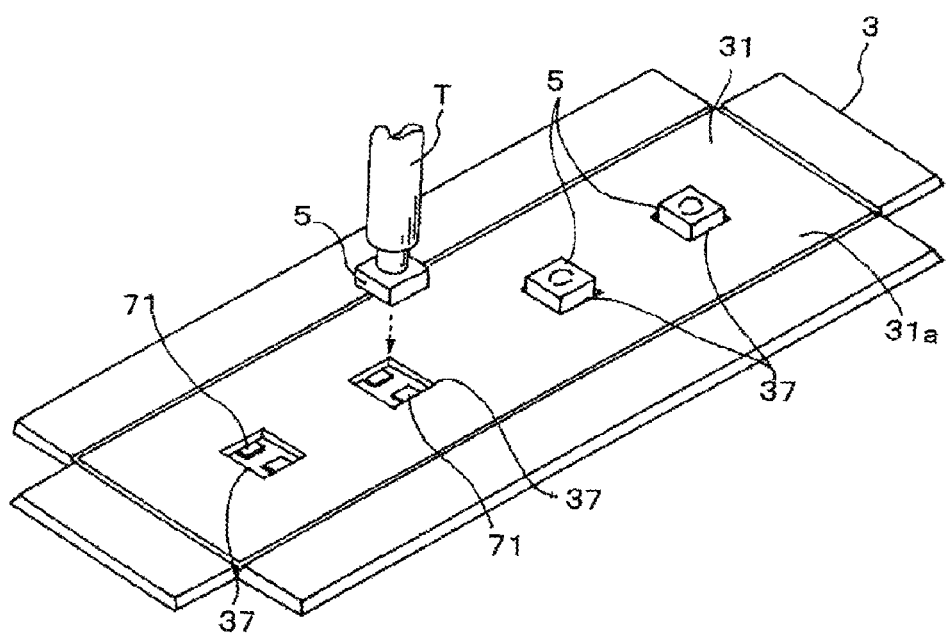
FIG. 6 is a schematic perspective view for explaining a manufacturing process (part 2).

Then, as illustrated in FIG. 6, the body 3 is set in an automatic reflow mounting machine (not illustrated) to perform the mounting of the LED chips 5. The body 3 is set in the automatic reflow mounting machine while the inner bottom surface 31a is directed upward. The LED chips 5 picked up by a tool T of the corresponding mounting machine are set within the concave portions 37 formed in the inner bottom surface 31a. The LED chips 5 are placed on the LED pads 71 exposed within the concave portions 37, and in that state, the reflow is performed so that the LED chips 5 are surface-mounted on the LED pads 71, respectively.

In this case, since the edges of each concave portion 37 are formed as the tapered surfaces 37a as illustrated in FIG. 4A, the outer edges of each LED chip 5, especially, the lower edges thereof are in contact with the corresponding tapered surfaces 37a when the LED chip 5 is placed on each LED pad 71, which enables self-alignment of the positioning of the LED chips 5 with respect to the concave portions 37, i.e., the positioning of the LED chips 5 with respect to the LED pads 71.

Figure 7A:
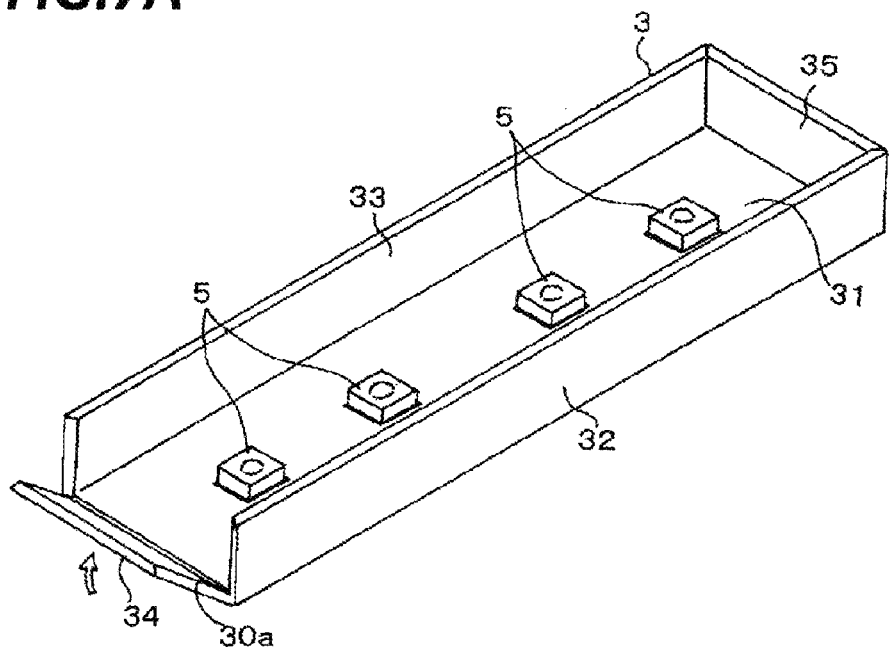
FIGS. 7A and 7B are schematic perspective views for explaining a manufacturing process (part 3).

Subsequently, as illustrated in FIG. 7A, the body 3 in which the LED chips 5 have been completely mounted is set in an automatic bending/welding machine (not illustrated), and first processed to be bent along the integral hinges 30a provided in the body 3. In the integral hinges 30a surrounding the bottom portion 31, the four side portions 32 to 35 are processed to be bent vertically in the thickness direction of the inner bottom surface 31a so that the bottom portion 31 and the four side portions 32 to 35 are formed in a rectangular container shape. Then, the side portions of the side portions 32 to 35 where the side portions 32 are in contact with each other are heated for a welding processing so that the bottom portion 31 and the four side portions 32 to 35 are formed as a rectangular container-shaped body.

Figure 7B:
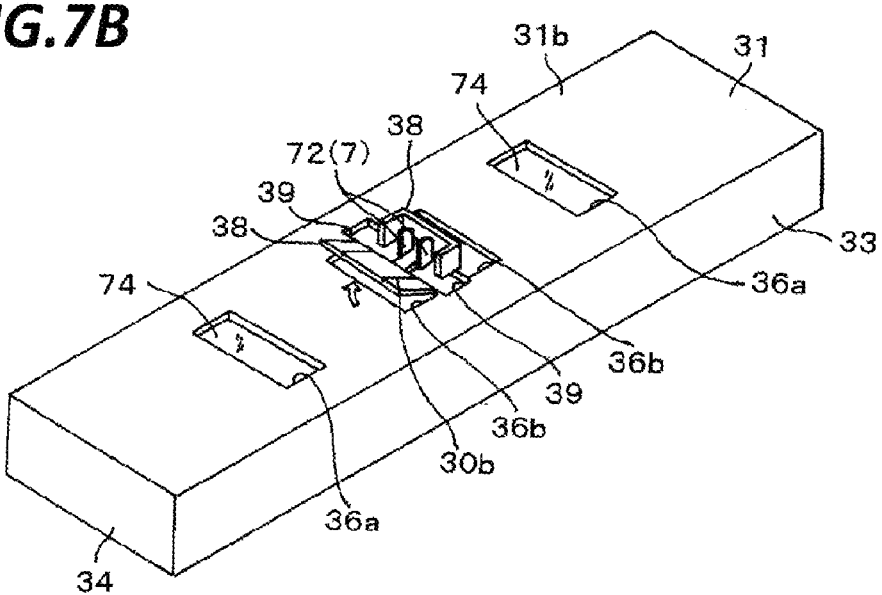

Simultaneously, as illustrated in FIG. 7B, the connector terminals 72 of the lead frame 7 which are exposed to the opening 39 of the outer bottom surface 31b of the bottom portion 31 are bent and erected vertically with respect to the outer bottom surface 31b. In addition, the piece portions 38 surrounded by the slits 38a of the outer bottom surface 31b are processed to be bent by using the integral hinges 30b. That is, first, the pair of piece portions 38 are bent and erected vertically in the outer surface direction along the integral hinges 30b. Since the piece portions 38 exist in the areas of the heat dissipating portions 74 of the lead frame 7, it is possible to bend and erect only the piece portions 38. Subsequently, both the ends of each bent and erected piece portion 38 are processed to be bent vertically. By the bending and erecting and the bending, the windows 36b are opened at the portions where the piece portions 38 are bent and erected, and the heat dissipating portions 74 of the lead frame 74 are also exposed in the windows 36b.

Then, the side portions of the pair of bent piece portions 38 where the piece portions 38 are in contact with each other are subject to a welding processing so that the rectangular container-shaped connector case 61 is formed to surround the connector terminals 72 as illustrated in FIG. 7B. That is, the connector 6 is formed by the connector terminals 72 and the connector case 61.

In addition, when the above-described dummy connecting portion (not illustrated) is provided in the lead frame 7, a part of the inner bottom surface 31a of the body 3 may be processed to have a hole or a notch with a depth exceeding the leading frame 7 such that the corresponding dummy connecting portion is disconnected, and the respective components of the lead frame 7 are insulated and separated from each other.

Then, as illustrated in FIGS. 1A and 1B, the front lens 4 is mounted on the opening of the body 3 formed in the rectangular container shape. Here, the mounting is performed by bonding or welding as described above. The front lens 4 is integrated with the body 3 so that the HMSL1 is completed. When the engagement pieces are formed in the front lens 4, the front lens 4 may be mounted simply by being engaged with the body 3.

As described above, in this manufacturing method, the manufacture of the HMSL is completed by the process of processing the lead frame 7, the process of insert-molding the processed lead frame 7 in a resin to form the body 3, the process of mounting the LED chips 5 on the lead frame 7 integrated with the body 3 through, for example, the reflow, the process of the bending and the bonding for the body 3 and the lead frame 7, and the process of mounting the front lens 4. Accordingly, the HMSL may be manufactured with a small number of components, and furthermore, a small number of manufacturing processes.

Figure 8A:
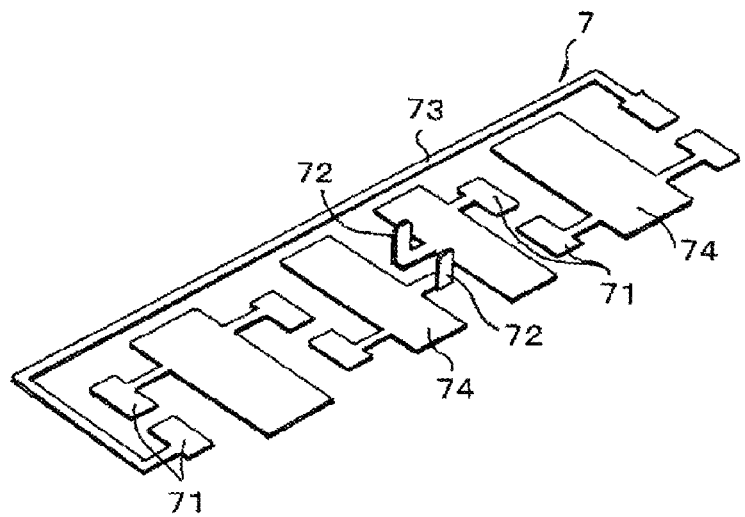
FIGS. 8A and 8B are schematic perspective view for explaining a partially modified manufacturing process.
Figure 8B:
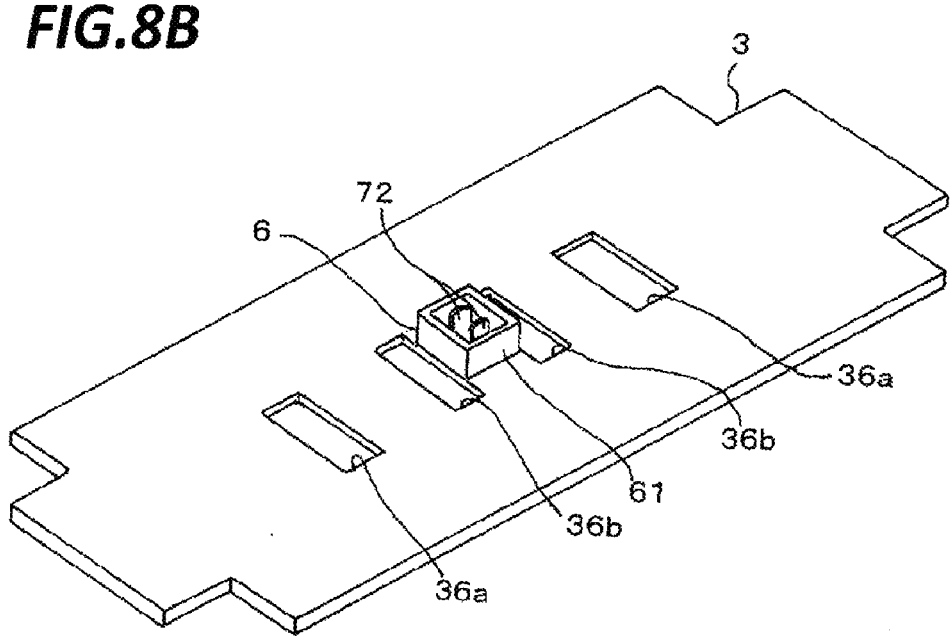

Here, as illustrated in FIG. 8A, when the lead frame 7 is formed, the connector terminals 72 may be bent and erected vertically toward the rear side, i.e., the outer bottom surface 31b side of the bottom portion 31, and in this state, the lead frame 3 may be insert-molded in the body 3. In the insert-molding of the body 3, the rectangular frame-shaped connector case 61 of the connector 6 is integrally molded at a part 38 of the rear surface of the body 3 as illustrated in FIG. 8B. Accordingly, the connector 6 may be formed simultaneously with the insert-molding of the body 3 so that the process of bending the connecter case 61 thereafter is unnecessary. Further, the strength of the connector case 61 also increases. In addition, even when the connector 6 is formed in advance on the rear side of the body 3, the automatic mounting of the LED chips 5 as illustrated in FIG. 6 may be implemented.

Exemplary Embodiment 2

Figure 9A:
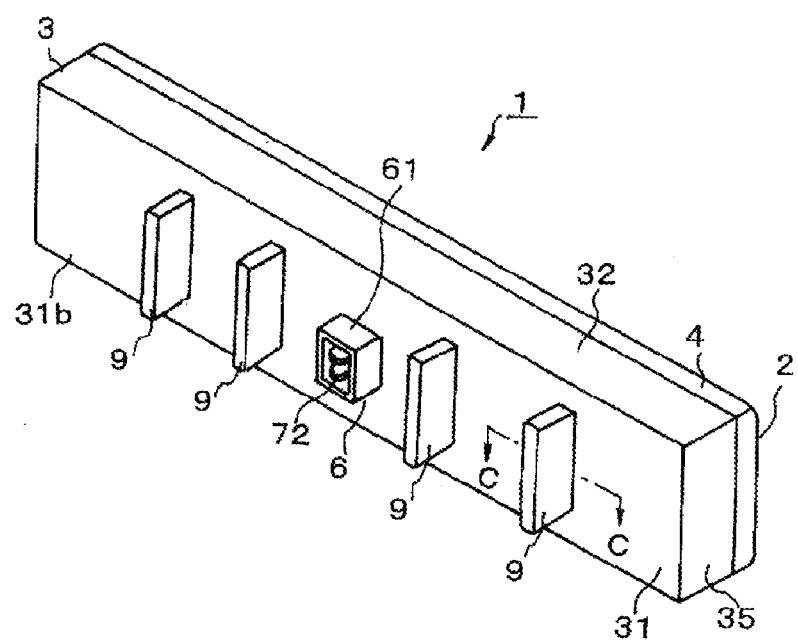
FIG. 9A is an appearance perspective view of an HMSL of Exemplary Embodiment 2 when viewed from the rear side.

FIG. 9A is a perspective view of an HMSL 1 of Exemplary Embodiment 2 when viewed from the rear side. In Exemplary Embodiment 2, the lead frame 7 and the body 3 are insert-molded in the same manner as those represented in FIGS. 8A and 8B. In this insert-molding, the degree of freedom of the shape of the body 3 increases. Hence, in order to improve the heat dissipating property in the body 3 by using the increased degree of freedom of the shape, a plurality of vertical wall-shaped heat dissipating pins 9 are formed to integrally project from the rear surface of the body 3. In addition, the windows 36a and 36b of Exemplary Embodiment 1 are not provided. The height dimension of each projecting heat dissipating pin 9 or the width dimension of the HMSL 1 along the vertical direction thereof is formed as large as possible without unnecessarily increasing the external size of the HMSL 1.

Figure 9B:
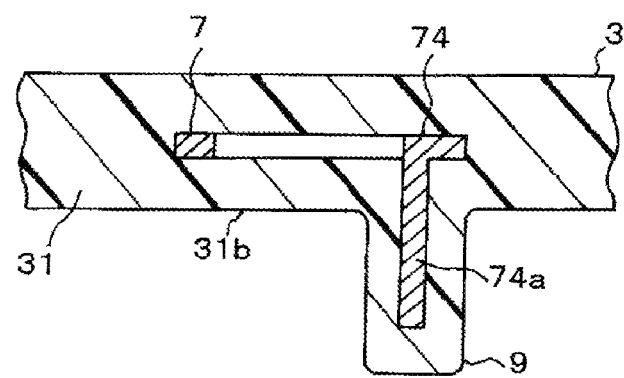
FIG. 9B is an enlarged cross-sectional view taken along the line C-C in FIG. 9A.

The heat dissipating pins 9 are arranged at the positions corresponding to the LED pads 71 provided in the lead frame 7 or the positions corresponding to the heat dissipating portions 74 of the lead frame 7. Here, the heat dissipating pins 9 are arranged at the positions corresponding to the heat dissipating portions 74. Then, as illustrated in FIG. 9B representing the enlarged cross-sectional view of the line C-C of FIG. 9A, a part 74a of each heat dissipating portion 74 of the lead frame 7 is curved to be erected almost vertically toward the rear surface, and the curved part 74a is coated with a part of the body 3 to serve as the core so that each heat dissipating portion 74 is formed.

Figure 10A:
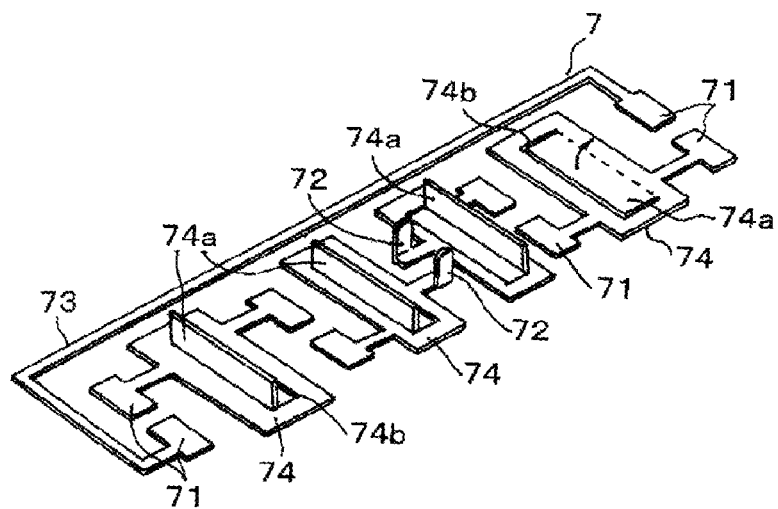
FIG. 10A is a perspective view of a lead frame.
Figure 10B:
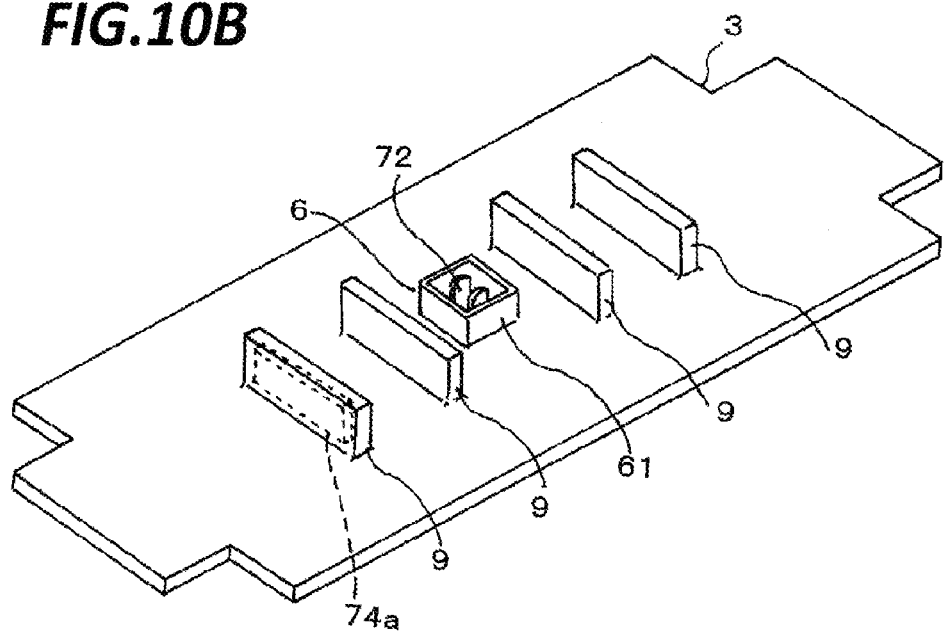
FIG. 10B is a rear side perspective view of an insert-molded body.

As illustrated in the perspective view of the lead frame 7 in FIG. 10A, U-shaped slits 74b are provided in each heat dissipating portion 74, and the part 74a of the heat dissipating portion 74 surrounded by the slits 74b is bent and erected vertically toward the rear side (the outer bottom surface 31b side of the bottom portion 31) so that the part 74a is curved against the plane surface direction of the lead frame 7. Then, by insert-molding the lead frame 7 in the body 3, the curved part 74a is installed as the core in a state of being integrally embedded inside the heat dissipating pin 9, as illustrated by the perspective view of FIG. 10B.

In this configuration of the body 3, the heat generated in the LED chips 5 is transferred from the LED pads 71 to the heat dissipating portions 74. Then, the heat is transferred from the heat dissipating portions 74 to the body 3 and dissipated to the outside from the rear surface of the body 3. In this case, in each heat dissipating portion 74, the part 74a projects toward the rear surface direction of the body 3, and the heat is dissipated from each heat dissipating pin 9 formed by covering the projecting opposite surfaces with the resin. By the heat dissipating pins 9, the heat dissipating area at the rear side of the body 3 is extended, and the heat transferred to the heat dissipating portions 74 may be dissipated with a high efficiency.

In addition, when the size of the lead frame 7 is enough, a part of an area different from the heat dissipating portions 74 may be curved and erected, and the curved part may be covered with the body 3 to serve as a part of the heat dissipating pins 9. For example, a part close to the LED pads 71 may be curved, and the curved part may be coated with a resin to form a heat dissipating pin 9. By forming the heat dissipating pin 9 at a position as close as possible to the LED pads 71, the heat dissipating effect may be further improved.

In addition, each heat dissipating pin 9 of Exemplary Embodiment 2 may not be configured as a heat dissipating pin having a part of the lead frame 7 as the core. For example, only by forming a part of the rear surface of the body 3 as a vertical wall projecting from the rear surface and configuring the vertical wall as a heat dissipating pin, the area of the rear surface of the body 3, i.e., the heat dissipation area may increase, thereby improving the heat dissipating effect.

In addition, the curved part 74a of each heat dissipating portion 74 or the other curved part of the lead frame 7 may not be coated with the resin of the body 3, and may be configured to project in a state of being exposed from the rear surface of the body 3. As long as any problem is not caused in the appearance or the external and internal environments of the HMSL 1, the heat dissipating pins may be configured by exposing the part 74a and others so that the heat dissipating effect may be further improved.

In Exemplary Embodiment 2 as well, when the lead frame 7 is formed, the connector terminals 72 may be bent and erected vertically toward the rear side, and in this state, the lead frame 7 may be insert-molded in the body 3, as in Exemplary Embodiment 1. In this insert-molding, when the rectangular frame-shaped connector case 61 of the connector 6 is integrally molded in the part 38 of the rear surface of the body 3, the connector 6 may be configured simultaneously with the insert-molding of the body 3, and the process of bending-processing the connector case 61 is unnecessary later. Furthermore, the strength of the connector case 61 also increases.

Figure 11A:
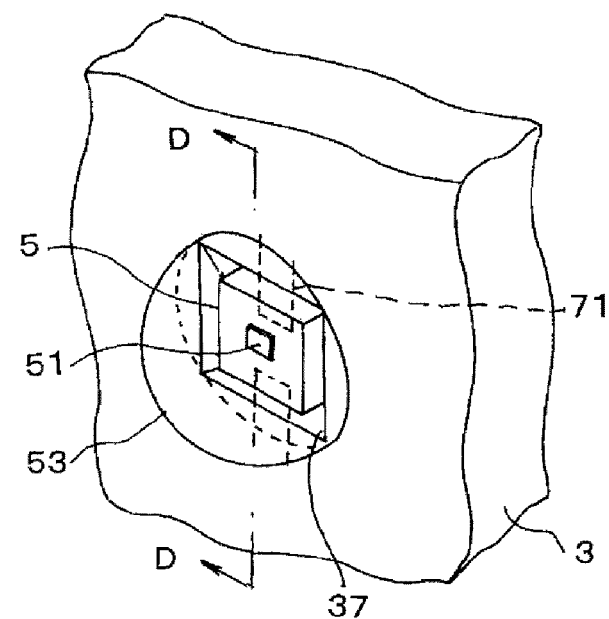
FIG. 11A is a perspective view of an LED pad.
Figure 11B:
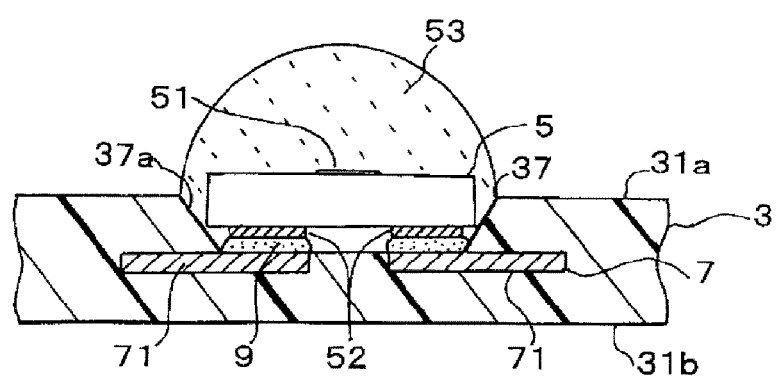
FIG. 11B is an enlarged cross-sectional view taken along the line D-D in FIG. 11A.

The present disclosure may adopt the configuration of sealing each LED chip 5 with a translucent material in either Exemplary Embodiment 1 or 2. FIGS. 11A and 11B represent a perspective view of a part of the LED pads 71 and an enlarged cross-sectional view along the line D-D of FIG. 11A. A translucent member 53 is provided in each concave portion 37 of the body 3 in which the LED pads 71 of the lead frame 7 are exposed, and an LED chip 5 is mounted. The LED chip 5 and the LED pads 71 are sealed by the translucent member 53.

Here, the translucent member 53 is formed by dropping and curing a molten translucent resin in the concave portion 37 through, for example, potting. The surface of the resin is formed in a spherical shape by the surface tension of the resin. Alternatively, a resin which was formed in advance in a predetermined shape or a translucent member such as, for example, glass may be attached. When the sealing is implemented by the translucent member 53, the LED chip 5 and the LED pads 71 are not exposed to the external environment so that the relevant reliability may be improved. In addition, as described above, the surface of the translucent member 53 is formed in a spherical shape or a predetermined curved shape so that the light emitted from the LED chip 5 may be refracted and controlled to form a desired light distribution.

In the exemplary embodiments, an example of the HMSL constituted with four LED chips as light sources has been described. However, the HMSL may be constituted with a different number of light sources. In addition, the light source is not limited to an LED chip, and may be an LD or other light sources as long as the light sources may be mounted by the automatic machine.

In the exemplary embodiments, the lead frame is embedded in only the bottom portion in order to facilitate the formation of the lamp housing by the bending of the molded body. However, the lead frame may be embedded over the side portions from the bottom portion as long as the bending of the body in which the lead frame is embedded may be implemented.

In the exemplary embodiments, an example where the present disclosure is applied to the HMSL has been described. However, the present disclosure may be identically applied to any lamp that has the configuration of mounting the light sources in the body. Especially, the present disclosure may be effectively applied to a lamp having the configuration in which light emitting sources may be mounted by the automatic machine such as, for example, reflow, when the light emitting elements are mounted on the lead frame integrally molded with the body.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A lamp comprising:
a resin-made body having a conductive lead frame integrally molded therein;
a light emitting element mounted on the lead frame; and
a connector including a connector case formed by bending at least a part of the body and a connector terminal formed by bending a part of the lead frame within the connector case,
wherein a pad provided in the lead frame is exposed within a concave portion provided on a surface of the body, and the light emitting element is mounted on the pad within the corresponding concave portion,
the lead frame further includes a wiring portion electrically connecting the pad and the connector terminal to each other and a heat dissipating portion serving as a part of the wiring portion, and
a window is opened at a portion of the body which corresponds to the heat dissipating portion of the lead frame, and a portion of the heat dissipating portion is exposed in the window.

2. The lamp of claim 1, wherein an edge of the concave portion is formed as a tapered surface in a thickness direction, and an outer edge of the light emitting element is in contact with the corresponding tapered surface.

3. The lamp of claim 1, wherein the body is formed as a lamp housing which is at least partially subject to a bending.

4. The lamp of claim 1, wherein the window is opened at a portion of the body adjacent to the connector case, and a part of the lead frame is exposed to the corresponding window.

5. The lamp of claim 1, wherein the body includes one or more heat dissipating pins projecting from a rear surface of the body.

6. The lamp of claim 5, wherein at least a part of the lead frame is curved, and the heat dissipating pin is formed as a heat dissipating pin in which the curved part is embedded inside the body or a heat dissipating pin in which the curved part is exposed to an outside from an inside of the body.

7. The lamp of claim 1, wherein the concave portion includes a sealing member configured to cover the pad and the light emitting element.

8. A lamp manufacturing method, comprising:
processing a conductive lead frame in a pattern shape including at least a pad and a connector terminal, a wiring portion electrically connecting the pad and the connector terminal to each other, and a heat dissipating portion serving as a part of the wiring portion;
integrally molding the lead frame with a resin material to form a body;
mounting a light emitting element on a pad exposed within a concave portion provided in the body;
bending a part of the body to form a lamp housing;
bending the connector terminal exposed from the body; and
forming a connector case at a part of the body,
wherein a window is opened at a portion of the body which corresponds to the heat dissipating portion of the lead frame, and a portion of the heat dissipating portion is exposed in the window.

9. The lamp of claim 1, wherein an inner surface of the body is subject to a surface processing to serve as a light reflecting surface.

* * * * *